United States Patent
Cameron et al.

[19]

[11] Patent Number: 6,028,426
[45] Date of Patent: Feb. 22, 2000

[54] TEMPERATURE COMPENSATED CURRENT MEASUREMENT DEVICE

[75] Inventors: Robert Fraser Cameron, Vancouver; Haakon MacCallum, Coquitlam, both of Canada

[73] Assignee: Statpower Technologies Partnership, Canada

[21] Appl. No.: 08/914,357

[22] Filed: Aug. 19, 1997

[51] Int. Cl.[7] .................................................. G01R 15/04
[52] U.S. Cl. .......................... 324/126; 324/130; 324/128
[58] Field of Search .................................... 324/126, 128, 324/105, 130

[56] References Cited

U.S. PATENT DOCUMENTS

| | | | |
|---|---|---|---|
| 4,186,339 | 1/1980 | Finger | 324/126 |
| 4,584,525 | 4/1986 | Harnden | 324/105 |
| 4,872,102 | 10/1989 | Getter . | |
| 4,998,061 | 3/1991 | Voisine | 324/105 |
| 5,083,081 | 1/1992 | Barrault | 324/105 |
| 5,170,336 | 12/1992 | Getter et al. . | |
| 5,293,145 | 3/1994 | Rynkiewicz . | |
| 5,600,550 | 2/1997 | Cook, II . | |

OTHER PUBLICATIONS

Product Brochure—Statpower Techologies Corporation. PROwatt line of power inverters. Copyright ©1996. Printed in Canada.

Product Brochure—Statpower Technologies Corporation. PORTAWATTZ line of power inverters. Copyright ©1996. Printed in Canada.

Product Brochure—Statpower Technologies Corporation. PROsine line of power inverters. Copyright ©1995. Printed in Canada.

Product Brochure—Statpower Technologies Corporation. PROsine Inverter Chargers Copyright ©1997. Printed in Canada.

*Primary Examiner*—Josie Ballato
*Assistant Examiner*—Jose M. Solis
*Attorney, Agent, or Firm*—Fulbright & Jaworski L.L.P.

[57] ABSTRACT

An apparatus and method for measuring electric current. The apparatus includes a conductive shunt for developing a voltage drop in response to current flow through the shunt, a temperature sensor for sensing the temperature of the shunt, and an amplifier for amplifying the voltage drop across the shunt. The voltage drop developed by the shunt has a known dependence upon the temperature of the shunt. The amplifier has an output for producing a current signal indicative of current flow through the shunt and has a gain dependent upon the temperature of the shunt, to compensate the current signal for changes in the voltage drop across the shunt due to the known dependence upon temperature of the voltage drop developed by the shunt.

7 Claims, 2 Drawing Sheets

TEMPERATURE COMPENSATED CURRENT MEASUREMENT DEVICE

BACKGROUND OF THE INVENTION

This invention relates to current shunts for measuring current in a circuit.

A current shunt is essentially a low value resistance element connected in a circuit as a means of sensing a measuring current. For measuring high currents, the resistance element may simply be a strip of metallic conductor with voltage sensing points at each end and a defined resistance between the two voltage sensing points. The current flowing through the shunt is calculated by measuring the voltage drop across the shunt, that is, between the two voltage sensing points, and dividing the voltage by the resistance of the shunt. A copper shunt suffers from a large change in resistance due to temperature. A significant current measurement error occurs if a fixed value for resistance is used in the calculation of the current through such a shunt. Typically, this error is large, as much as 35 percent over 0 degrees celsius to 100 degrees celsius. In the prior art, this effect is overcome by using a more expensive material such as manganin instead of copper, the manganin having a much smaller change in resistance with temperature.

The use of a separate, more expensive material, obviously adds expense to the measurement device, but also adds mechanical connections between existing circuit components and the more expensive material. The addition of mechanical connections, increases resistance and increases susceptibility to problems due to corrosion, oxidation, mechanical fatigue and the like.

It would be desirable, therefore, to sense current through an existing circuit component without the need for additional mechanical connections, and without the need for a more expensive material with a small resistance-temperature coefficient. The present invention addresses this need.

BRIEF SUMMARY OF THE INVENTION

In accordance with one aspect of the invention, there is provided an apparatus for measuring electric current. The apparatus includes a conductive shunt for developing a voltage drop in response to current flow through the shunt, a temperature sensor for sensing the temperature of the shunt, and an amplifier for amplifying the voltage drop across the shunt. The voltage drop developed by the shunt has a known dependence upon the temperature of the shunt. The amplifier has an output for producing a current signal indicative of current flow through the shunt and has a gain dependent upon the temperature of the shunt, to compensate the current signal for changes in the voltage drop across the shunt due to the known dependence upon temperature of the voltage drop developed by the shunt.

Preferably, the conductive shunt has a resistance which increases with temperature of the resistance and preferably, the gain is increased generally proportionally to an increase in temperature of the resistance.

Preferably, the conductive shunt includes a solid copper strip.

Preferably, the temperature sensor includes a negative temperature coefficient thermistor.

Preferably, the amplifier includes an operational amplifier having a fixed gainstage and an voltage divider, the voltage divider including the negative coefficient thermistor.

Preferably, the voltage divider includes first and second resistances and the negative coefficient thermistor connected in series.

Preferably, the negative coefficient thermistor has a resistance which varies inversely proportional with temperature.

In accordance with another aspect of the invention, there is provided a method of measuring current. The method includes the steps of:

a) developing a voltage drop across a conductive shunt, in response to current flow through the shunt, the voltage drop having a known dependence upon the temperature of the shunt;

b) sensing the temperature of the shunt;

c) adjusting the gain of an amplifier for amplifying the voltage drop across the shunt, by an amount dependent upon the temperature of the shunt to compensate for changes in the voltage drop across the shunt due to the known dependence of the shunt upon temperature.

BRIEF DESCRIPTION OF THE SEVERAL VIEWS OF THE DRAWING

In drawings which illustrate embodiments of the invention.

DETAILED DESCRIPTION OF THE INVENTION

In accordance with a first embodiment of the invention is shown generally at 10. The apparatus includes a copper conductive member shown generally at 12, a differential amplifier shown generally at 14 and a voltage divider shown generally at 16.

Conductive Shunt

Figure 1:
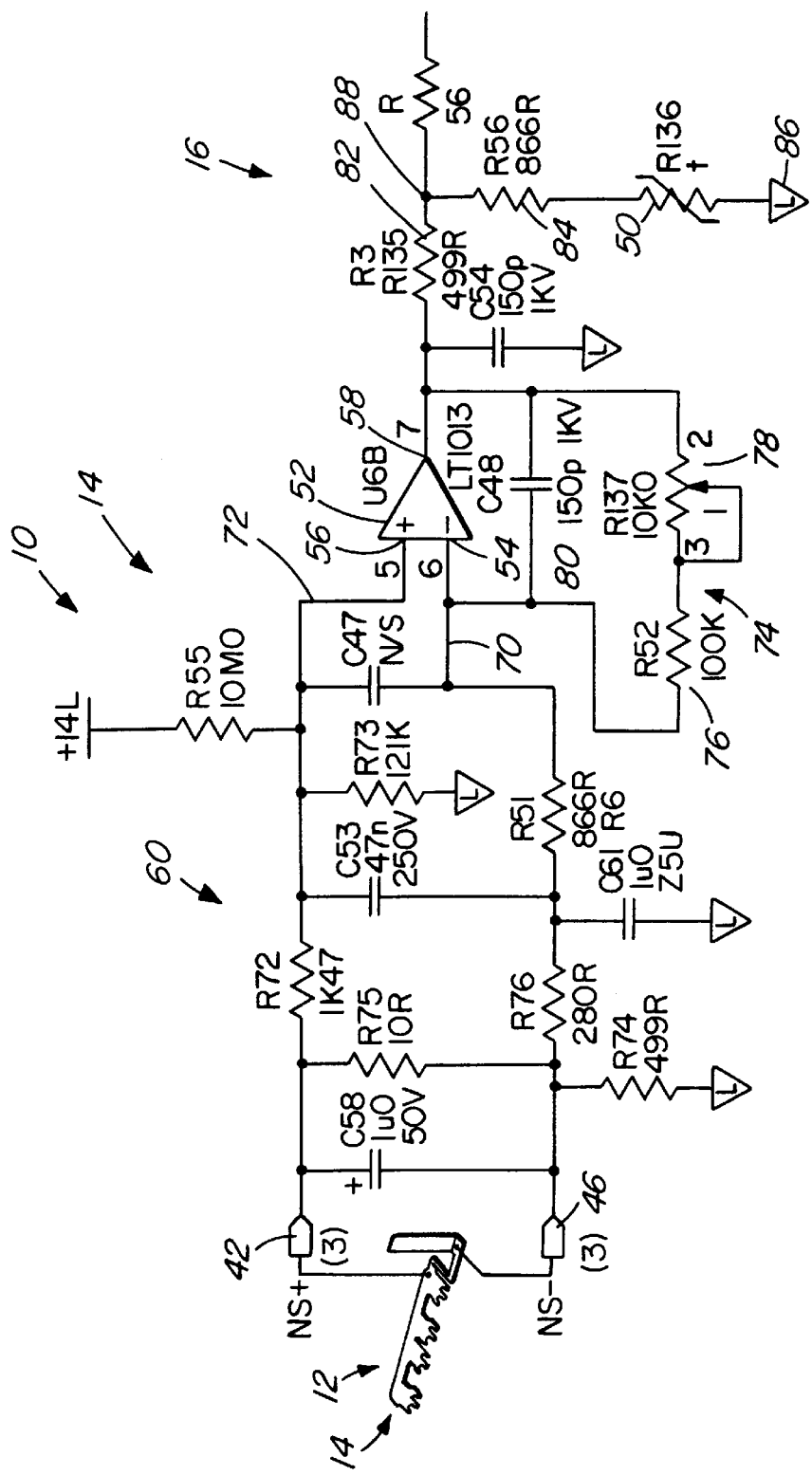
FIG. 1 is a schematic diagram of an apparatus, according to a first embodiment of the invention.
Figure 2:
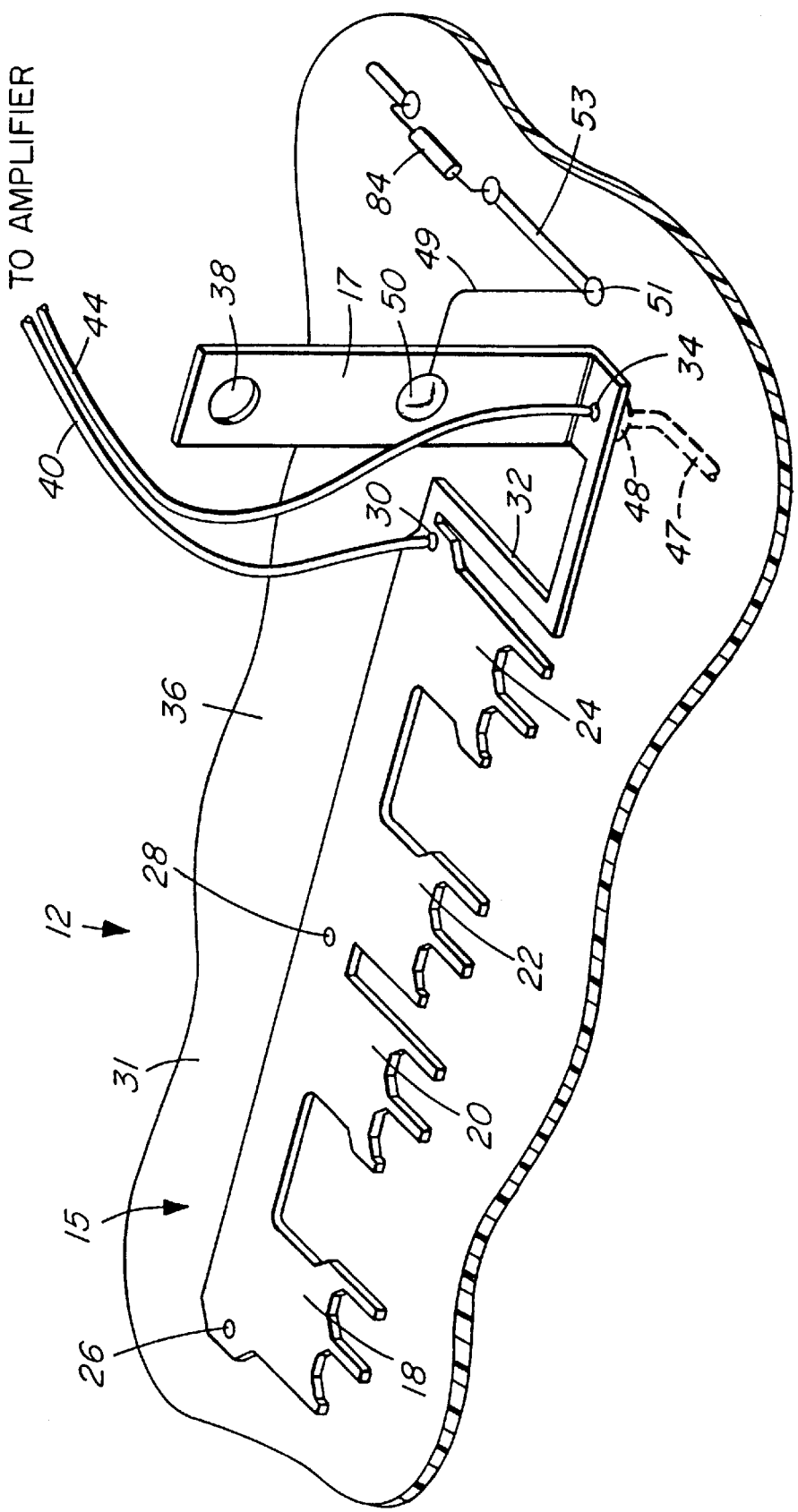
FIG. 2 is a perspective view of a conductive shunt according to the first embodiment of the invention.

Referring to FIG. 2, the conductive member is shown generally at 12. The conductive member has a first portion 15 disposed in a first plane and has a second portion 17 disposed in a second plane at right angles to the first plane. The first portion has first, second, third and fourth finger portions 18, 20, 22 and 24 and has first, second and third rivet holes 26, 28 and 30. The finger portions are for connection to switching transistors (not shown) and the rivet holes are for mounting the member to a circuit board 31. The member 12 is secured to a printed circuit board 31 using the rivet holes 26, 28 and 30. Circuit board pads are provided under adjacent respective rivet holes such that the member makes contact with the pads connected by traces to components on the circuit board, the components including those of the differential amplifier 14 and voltage divider 16 shown in FIG. 1.

The member further includes a right angled strip of material which acts as a shunt 32 which extends between the first and second portions 15 and 17. The second portion 17 has a first rivet hole 34 and the resistance of the shunt 32 is measurable between the rivet holes 30 and 34.

The second portion of the conductive member has an opening 38 to which a bus bar may be connected for conduction of high current, through the second portion 17 through the shunt 32, and into the first portion 15.

A first circuit board trace 40 extends from a circuit pad under and in contact with rivet hole 30 to a first input terminal 42 of the amplifier shown in FIG. 1. Referring back to FIG. 2, a second circuit board trace 44 extends from the pad under rivet hole 34 to a second terminal 46 of the amplifier shown in FIG. 1. Thus, the shunt is connected between the first and second input terminals 42 and 46 of the amplifier 14.

Referring back to FIG. 2, the circuit board 31 has a signal ground trace 47 having a termination pad 48 on which the rivet hole 34 rests. Thus, this point of the conductive member is at ground potential. A thermistor 50 has a case which is soldered directly to the second portion 17 and is therefore in thermal conduction with the second portion 17 and at the same potential as the second portion that is, ground potential.

As the second portion 17 is part of the same piece of copper forming the shunt 32, these portions are in thermal conduction with each other and therefore the temperature of portion 17 is representative of the temperature of the shunt 32. A temperature measured by the thermistor 50 is thus the temperature of the shunt 32.

Current flowing through the resistive portion 32 produces a voltage drop between the rivet holes 30 and 34 which act as voltage sense points. It will be appreciated that the effective resistance of the shunt 32 varies in relation to temperature, and therefore, the voltage drop between the rivet holes 30 and 34 also varies with temperature.

The variance of resistance due to temperature is given in the prior art as:

$$\alpha(T_2-25)$$

Where:
 $\alpha$ is a constant for the material under consideration, in this embodiment 0.0043;
 $T_2$ is the operating temperature of the resistance portion; and
 25 is a standard temperature in degrees celsius.

Thus, the absolute resistance of the resistance portion is given as $$R_2 = R_{25}[1+\alpha(t_2-25)]$$

Where:
 $R_2$ is the resistance at the operating temperature;
 $T_2$ is the operating temperature of the resistance portion;
 $R_{25}$ is the resistance at 25° celsius; and
 $\alpha$ in this embodiment is 0.0043.

Thus, the effective resistance of the shunt 32 has a known dependence on temperature and therefore, it may be said that the voltage drop across the shunt has a known dependence upon the temperature of the shunt.

Thermistor

In this embodiment, the thermistor is a negative temperature coefficient thermistor having a tolerance of 5 percent. The specific thermistor used in this embodiment is manufactured by Keystone under part number RL2006-1600-103-D1. In this embodiment, the thermistor has a resistance which varies inversely proportional with temperature.

Differential Amplifier

In this embodiment, the differential amplifier includes an operational amplifier 52 having an inverting input 54, a non-inverting input 56 and an output 58. In this embodiment, the operational amplifier is an LT 1013 manufactured by Motorola Inc. The differential amplifier includes an input network 60 having first and second input terminals 62 and 64 to which are connected circuit board traces 40 and 44 shown in FIG. 2, which are connected to the first and second voltage sense points 30 and 34 respectively. The input network is a low noise input network and has outputs 70 and 72 which are connected to the inverting and non-inverting inputs 54 and 56 of the operational amplifier 52, respectively.

The differential amplifier further includes a feedback path 74. The feedback path includes a fixed resistor 76, an adjustable resistor 78 and a filter capacitor 80. The fixed resistor 76 and adjustable resistor 78 are connected in series across the inverting input 54 and the output 58, and act in cooperation with the input network 60 to cause the differential amplifier to have a gain, which in this embodiment, is approximately 1000. Thus, in response to a voltage drop of approximately 1 mV across the rivet holes 30 and 34, the output 58 of the operational amplifier produces a signal having a voltage level of approximately 1.0 volt. The adjustable resistor 78 provides for adjustment of the gain for calibration of the differential amplifier 14.

Voltage Divider

Still referring to FIG. 1, the voltage divider includes first and second fixed precision resistors 82 and 84 respectively. In this embodiment, these resistors have values of 499 ohms and 866 ohms respectively. Referring to FIG. 2, a first lead wire 49 of the thermistor 50 is connected to a circuit pad 51 which is connected to the second resistor 84 through a circuit board trace 53. The case of the thermistor is connected to signal ground through a connection to the second portion 17 and the rivet hole 34. Thus, the first resistor, the second resistor and the thermistor are connected in series. Referring back to FIG. 1, an output 88 of the voltage divider is provided at a circuit node between the first and second resistors 82 and 84. Thus, the voltage divider 16 acts a voltage divider including the negative coefficient thermistor.

A voltage signal of approximately 0.6 volts is provided at the output 88, in response to a 1 mV voltage drop across the rivet holes 30 and 34. Effectively, the differential amplifier 14 and the voltage divider 16 act as an amplifier circuit for amplifying the voltage drop across the shunt by an amount dependent upon the temperature of the shunt, to compensate for changes in the voltage drop across the shunt due to the known dependence of the shunt resistance upon temperature.

Operation

Referring to FIGS. 1 and 2, at an ambient temperature of approximately 25 degrees celsius, with no current flowing through the first portion 15, the thermistor 50 presents a nominal resistance to the voltage divider 16 and a voltage of 0 volts is provided at the output 88, as no current is flowing through the copper bar.

When current flows through the shunt 32, a voltage is developed thereacross, this voltage being developed between the rivet holes 30 and 34. The voltage appearing across these points is amplified by the differential amplifier 14 and the instantaneous temperature of the bar due to the current flowing through it and ambient conditions, causes the thermistor 50 to present a new resistance to the voltage divider 16. Assuming the current through the effective resistance creates heating of the resistive portion 32, the resistance produced by the thermistor 50 is reduced from its nominal value and therefore, a lesser resistance is presented to the voltage divider 16.

At the same time, as the temperature of the shunt 32 increases, the voltage drop between the rivet holes 30 and 34 increases. Therefore, a signal having a higher than nominal voltage level appears at the output 58 of the operational amplifier 52 however, the thermistor in the voltage divider 16 increases the attenuation of the signal appearing at the output 58 of the operational amplifier 52 due to the lesser resistance presented by the thermistor 50. This compensates for the increased voltage drop across the rivet holes 30 and 34, due to temperature. A reverse effect occurs as the resistive portion cools.

The signal appearing at the output 58 of the operational amplifier 52 varies by perhaps 35 percent over a temperature range of 0 to 100 degrees celsius. However, after the signal passes through the temperature compensated voltage divider 16, the signal appearing at output 88 varies by about plus or minus 2 percent over the same temperature range. This is equivalent to or better than the accuracy provided with conventional shunts such as Manganin shunts, and therefore, avoids the need to use materials with small resistance temperature coefficients.

In addition, as copper is commonly the preferred choice for conductive members such as conductive bus bars and the like in power circuits, current measurement of current flowing through such bus bars can be made relatively accurately, without the need to make a separate mechanical connection to a material having a low resistance temperature coefficient, in series with the copper bus bar. Only one mechanical connection to the shunt is required. This at least minimizes the number of mechanical connections and minimizes problems associated with mechanical connections, which includes potentially high resistance, oxidation problems, fatigue, etc.

While specific embodiments of the invention have been described and illustrated, such embodiments should be considered illustrative of the invention only and not as limiting the invention as construed in accordance with the accompanying claims.

What is claimed is:

1. An apparatus for measuring current, the apparatus comprising:
    a) a conductive shunt for developing a voltage drop due to current flow therethrough;
    b) a low noise input network connected to said conductive shunt;
    c) a fixed gain amplifier connected to said low noise input network to amplify said voltage drop to produce a current signal representing current flow through said conductive shunt; and
    d) an attenuator connected to said amplifier to attenuate said current signal, said attenuator including a temperature sensor for sensing temperature of said shunt and connected to said fixed gain amplifier such that said current signal is attenuated by an amount dependent upon temperature of said shunt.

2. An apparatus as claimed in claim 1 wherein said conductive shunt has a resistance which increases with temperature of said resistance and wherein said attenuator attenuates said current signal generally proportionally to an increase in temperature of said resistance.

3. An apparatus as claimed in claim 2 wherein said temperature sensor includes a negative temperature coefficient thermistor.

4. An apparatus as claimed in claim 2 wherein said conductive shunt includes a solid copper strip.

5. An apparatus as claimed in claim 3 wherein said attenuator includes a voltage divider including said negative coefficient thermistor.

6. An apparatus as claimed in claim 5 wherein said voltage divider includes first and second resistances and said negative coefficient thermistor connected in series.

7. A method of measuring current, the method comprising:
    a) developing a voltage drop across a conductive shunt;
    b) applying said voltage drop to a low noise input network connected to a fixed gain amplifier;
    c) amplifying said voltage drop with said fixed gain amplifier to produce a current signal representing current flow through said conductive shunt; and
    d) attenuating said current signal by an amount dependent upon temperature of said shunt to compensate said current signal for changes in said voltage drop across said shunt due to said known dependence of said shunt upon temperature.

* * * * *